United States Patent [19]
Schumacher, III

[11] Patent Number: 4,840,702
[45] Date of Patent: Jun. 20, 1989

[54] APPARATUS AND METHOD FOR PLASMA TREATING OF CIRCUIT BOARDS

[75] Inventor: John E. Schumacher, III, Boulder, Colo.

[73] Assignee: Action Technologies, Inc., Boulder, Colo.

[21] Appl. No.: 138,962

[22] Filed: Dec. 29, 1987

[51] Int. Cl.$^4$ .................. B44C 1/22; C03C 15/00; C03C 25/06; C23F 1/02

[52] U.S. Cl. ........................ 156/643; 134/1; 156/646; 156/656; 156/659.1; 156/345; 156/902; 204/192.32; 204/298

[58] Field of Search ............ 156/643, 646, 656, 659.1, 156/902, 345; 204/192.32, 192.35, 298; 134/1; 427/96-98; 174/68.5; 29/846, 852

[56] References Cited

U.S. PATENT DOCUMENTS

| | | | |
|---|---|---|---|
| 4,166,018 | 8/1979 | Chapin | 204/298 X |
| 4,328,081 | 5/1982 | Fazlin | 156/345 X |
| 4,425,210 | 1/1984 | Fazlin | 204/298 X |

Primary Examiner—William A. Powell
Attorney, Agent, or Firm—Robert E. Harris

[57] ABSTRACT

An apparatus and method for improved plasma treating of circuit boards is disclosed wherein a plasma treating zone and a gas resupply zone are established in a chamber, an actuating mechanism being provided to establish relative movement between the circuit boards and the zones during treatment of the circuit boards. The apparatus preferably includes a chamber for receipt of a gas and having electrodes centrally positioned therein for generating an electrical field at a central portion of the chamber thereby exciting the gas thereat and creating a zone of intense plasma. A transport mechanism is provided in the chamber for moving the circuit boards alternately into and out of the central portion of the chamber for preselected periods of time thus alternately exposing the circuit boards to the intense plasma and to substantially fresh gas outside of the central portion of the chamber thereby providing more uniform plasma treatment of the surface areas of the circuit boards and improved cleaning and etching of openings through the circuit boards which receive a fresh supply of gas therein when the circuit boards are outside of the central portion of the chamber. Using appropriate electrodes the same apparatus may be employed for deposition of metallic layers on the boards in a substantially continuous operation after plasma treating thereof.

22 Claims, 4 Drawing Sheets

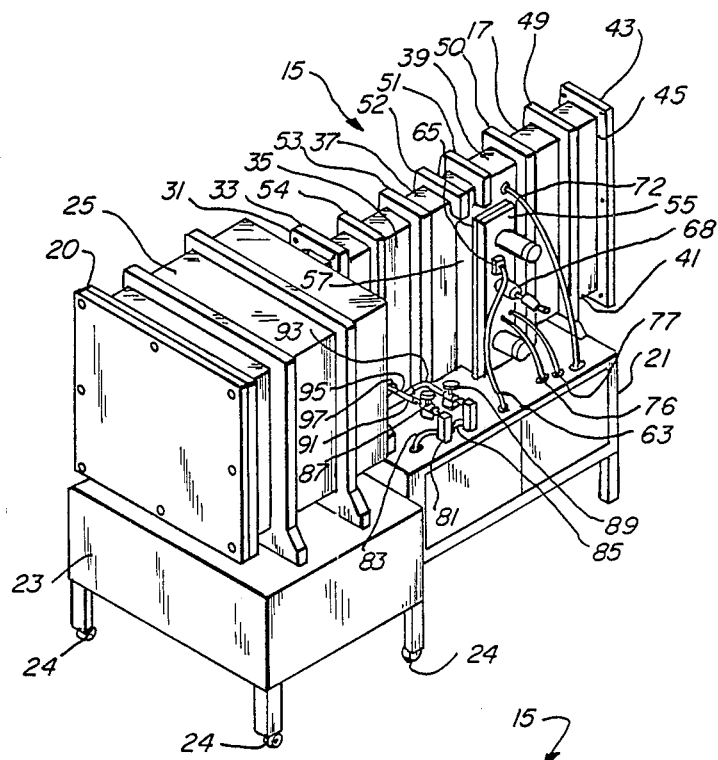
Fig_1
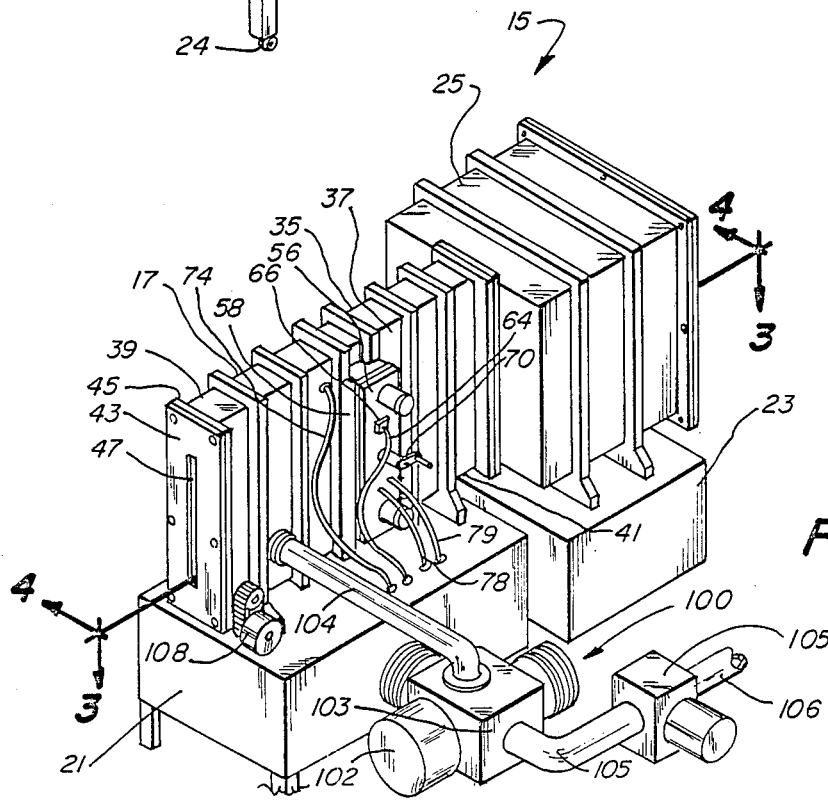
Fig_2

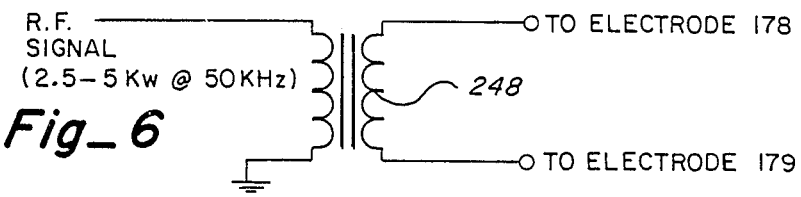
Fig_6
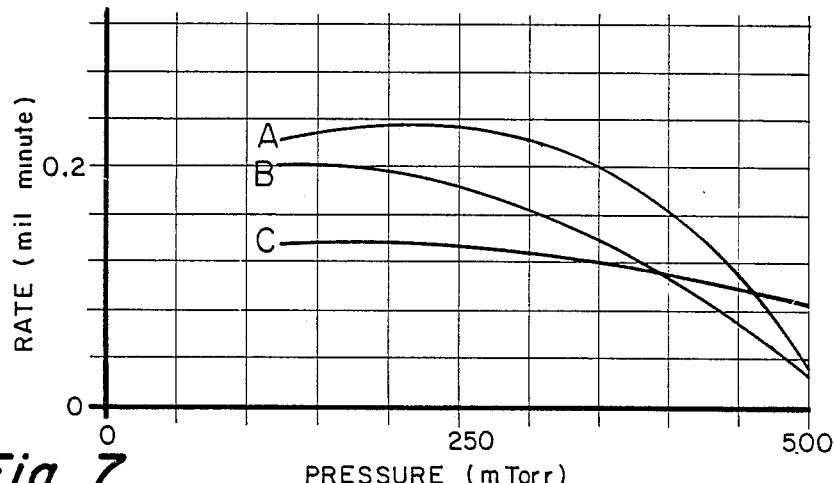
Fig_7
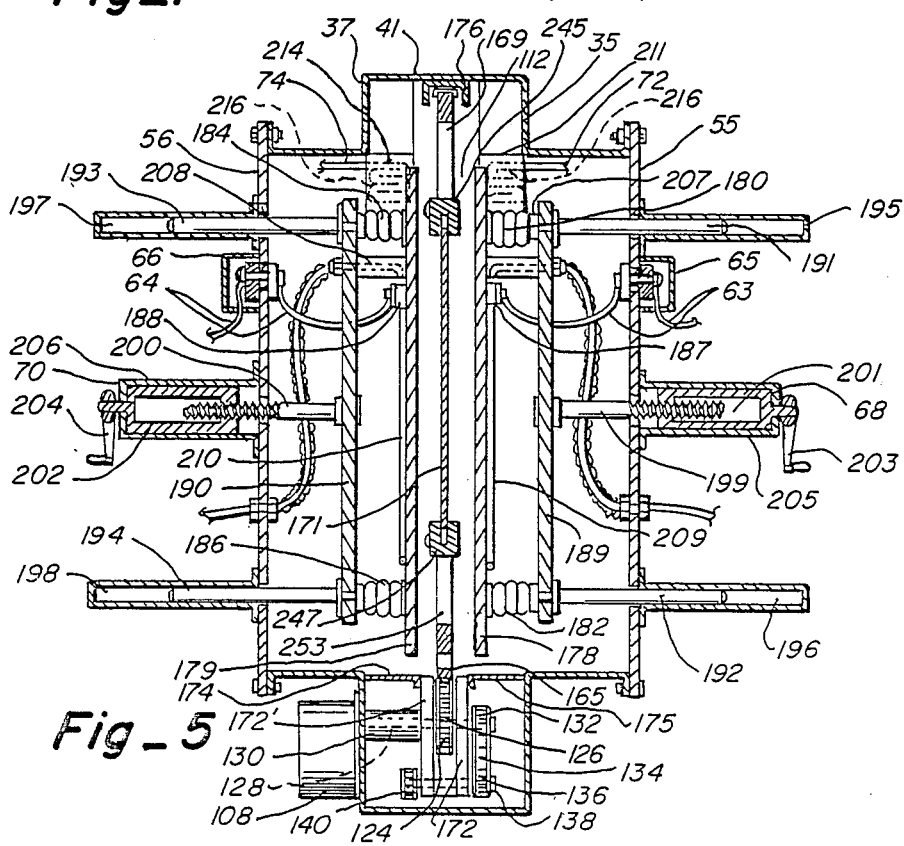
Fig_5

APPARATUS AND METHOD FOR PLASMA TREATING OF CIRCUIT BOARDS

FIELD OF THE INVENTION

This invention relates to an apparatus and method for treating circuit boards, and, more particularly, relates to an apparatus and method for plasma treating of printed circuit boards for enhancing board quality.

BACKGROUND OF THE INVENTION

Devices and methods for exposure of printed circuit board substrates to a gaseous plasma (generally defined as gaseous matter in an elevated state, and more specifically for purposes of this application defined as gas molecules excited by exposure to an electrical field thereby forming ions and free radicals) for enhancing board quality by improving one or more of etching, cleaning and activation of substrates, desmearing of openings, or holes, through the circuit board, conductive surface oxide removal and the like have been heretofore suggested and/or utilized. Known devices have included devices and methods employing a chamber, a vacuum pump, a source of RF energy and metered gases (as is well known in the art). Such devices, however, have not proved completely effective in providing uniform plasma treatment of all areas of the circuit boards, and particularly including openings provided through the circuit board.

Devices and methods have been suggested and/or utilized for improving the uniformity of plasma treatment of printed circuit boards, including multilayered printed circuit boards. Such devices have included arrangements for improving the flow of plasma through the holes in the circuit boards, by, for example, reversing the flow of plasma and/or providing a plurality of electrode pairs supplied with varying quantities of electrical energy to compensate for saturation of plasma gases as the plasma flows from one end of the chamber to the other (see U.S. Pat. Nos. 4,328,081 and 4,425,210).

While some such devices as have heretofore been suggested and/or utilized have improved uniformity of plasma treatment of printed circuit boards, further improvements could nevertheless still be utilized.

SUMMARY OF THE INVENTION

This invention provides an apparatus and method for improved plasma treating of objects, for example printed circuit boards including the walls of openings therethrough. The apparatus includes a chamber for receipt of a gas, electrodes for establishing an electrical field within the chamber to thereby excite gas exposed thereto forming a plasma treating zone while gas not exposed thereto remains substantially unexcited thus resulting in one or more gas resupply zones, and an actuating mechanism for effecting relative movement between the printed circuit boards and the electrical field so that the printed circuit boards are alternately exposed for preselected periods of time to the plasma for treatment thereof and to the unexcited gas thus supplying fresh gas within the openings through the circuit boards. Actuation may be accomplished by either moving the plasma treating zone, for example by linear movement of either a single pair of electrodes or sequential activation of a plurality of linearly spaced pairs of electrodes in the chamber, or by movement of the circuit boards into and out of the plasma treating zone.

It is therefore an object of this invention to provide an apparatus and method for improved plasma treating of objects.

It is another object of this invention to provide an apparatus for plasma treating of circuit boards which includes excited gas and unexcited gas zones to which the circuit boards are alternately exposed.

It is another object of this invention to provide an apparatus for improved plasma treating of circuit boards which includes an actuating mechanism for effecting relative movement in a chamber between the circuit boards and a plasma treating zone.

It is another object of this invention to provide an apparatus for improved plasma treating of circuit boards wherein intensity and confinement of a plasma treating zone is enhanced.

It is still another object of this invention to provide an apparatus for improved plasma treating of printed circuit boards which includes a chamber for receiving and containing a gas and which has a central portion and opposite end portions, with electrodes positioned at the central portion thereof to establish an electrical field thereat so that gas exposed thereto is excited forming a plasma while gas in the end portions of the chamber remains substantially uneffected, or fresh, and transport means for transporting the printed circuit board between the opposite end portions and through the central portion of the chamber thereby alternately exposing the board to the plasma and to fresh gas for preselected periods of time.

It is yet another object of this invention to provide a method for improved plasma treating of objects wherein the objects are alternately exposed to an excited gas, or plasma, for treatment of the objects, and to unexcited, or fresh, gas.

It is still another object of this invention to provide an apparatus for treating printed circuit boards where the boards are cleaned and activated, and have a metallic layer deposited thereon using substantially the said apparatus in a substantially continuous process.

It is still another object of this invention to provide an apparatus and method for plasma cleaning and/or etching of circuit boards and desmearing and/or etchback of openings therethrough wherein the boards are alternately moved through a plasma treating zone and at least a first gas resupply zone thereby progressively exposing, or scanning, the surface of the circuit board with the plasma and exciting, or charging, gas in the openings through the circuit board while moving the circuit board through the plasma treating zone, and resupplying the openings through the circuit board with fresh gas while moving the circuit board through the gas resupply zone, whereby more uniform surface etching and/or cleaning of the circuit boards and desmearing and/or etchback of the openings is accomplished.

With these and other objects in view, which will become apparent to one skilled in the art as the description proceeds, this invention resides in the novel construction, combination, arrangement of parts and method substantially as hereinafter described, and more particularly defined by the appended claims, it being understood that changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which:

FIG. 1 is a front perspective view of an apparatus for plasma treating of printed circuit boards;

FIG. 2 is a rear perspective view of the apparatus shown in FIG. 1;

FIG. 5 is a cross-sectional view of the apparatus taken along section line 5—5 of FIG. 4;

FIG. 6 is a simplified electrical diagram of one electrode power supply technique useful for further confining plasma formation to the area between the faces of the electrodes of the apparatus; and FIG. 7 is a graphic illustration of etch rate test data gathered while employing the apparatus and method of this invention.

DESCRIPTION OF THE INVENTION

Figure 3:
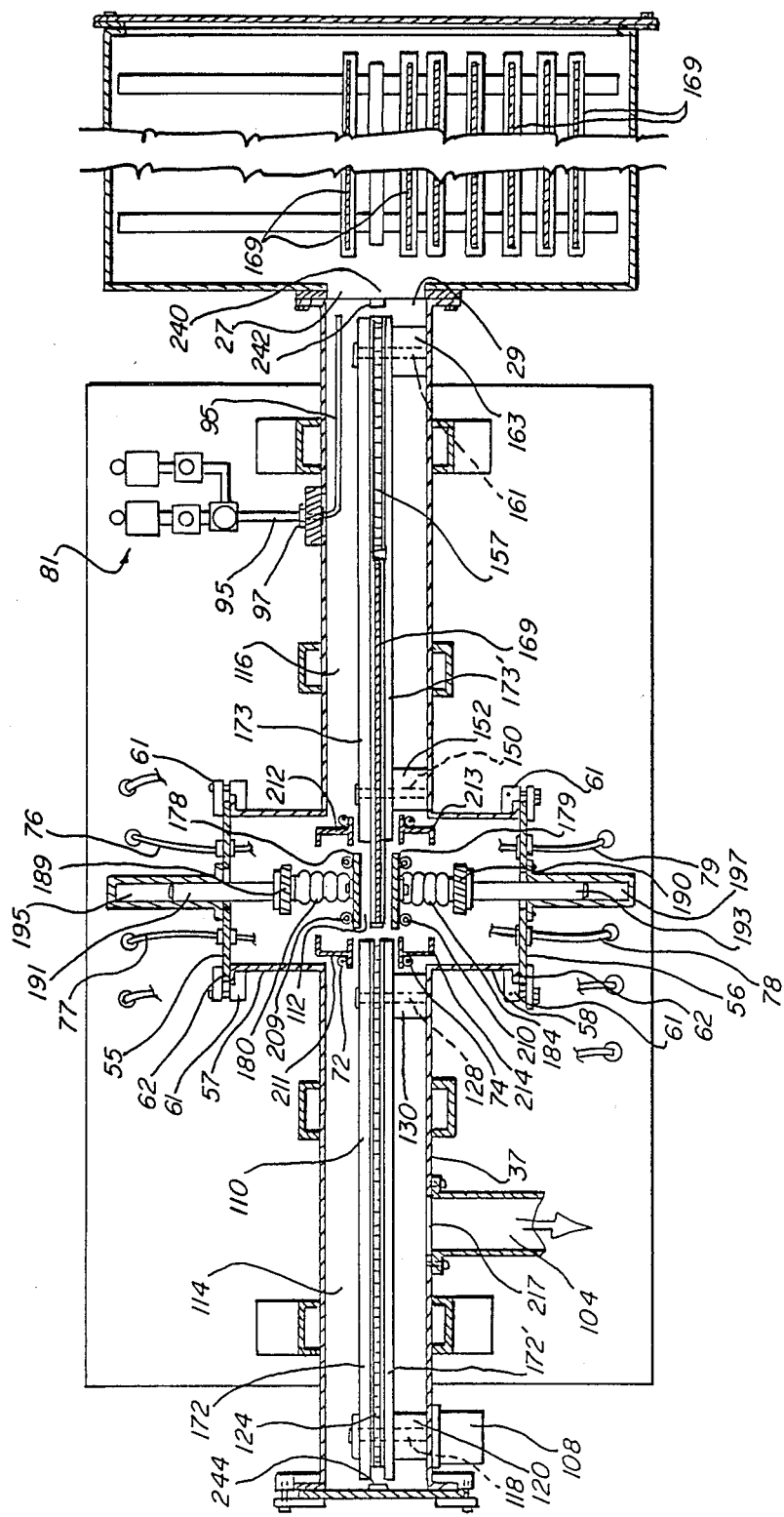
FIG. 3 is a cross-sectional view of the apparatus taken along section line 3—3 of FIG. 2 and particularly illustrating an actuating mechanism for moving circuit boards through a plasma treating zone in the central portion of the apparatus.

An apparatus 15 for plasma treatment of printed circuit boards is shown in perspective in FIGS. 1 and 2. Apparatus 15 includes treating chamber 17 and may optionally include a cassette circuit board loader and unloader 20. Chamber 17 and cassette loader 20 are arranged, for example, on stands 21 and 23 respectively either one or both of which may be made movable on casters 24. Cassette loader and unloader 20 consists of a substantially sealable chamber 25 with an opening 27 adjacent to opening 29 in chamber 17 (shown in FIG. 3).

Cassette loader and unloader 20 is sealably attachable to chamber 17 at mated openings 27 and 29, for example by bolting chamber locks 31 and 33 together to thereby preserve a substantially sealed environment therebetween which is capable of evacuation to a low pressure. Alternately, chamber 17 may include a sealable door at opening 29 thereof (not shown) for manual loading and unloading of printed circuit boards.

Chamber 17 is made for example of a heavy gauge stainless steel capable of withstanding the reduced pressure within the chamber, and includes chamber side walls 35 and 37, and upper and lower chamber walls 39 and 41. End wall 43 is mounted to chamber reinforcing plate 45 and may include window 47 therein. Chamber reinforcing ribs 49 through 54 are provided at intervals around the chamber walls.

Electrode mounting plates 55 and 56 are retractable mounted on mounting locks 57 and 58 of chamber 17 respectively by, for example, bolt tightened latches 61 (as shown in FIG. 3) at the edges of plates 55 and 56 and over lips 62 on locks 57 and 58. Power supply lines 63 and 64 are provided for supplying power to the electrodes (typically from a conventional DC or RF power supply, not shown herein) and pass through insulator blocks 65 and 66 in mounting plates 55 and 56 to the interior of chamber 17. The power supply to the electrodes is conventionally controlled and may, for example, simply include an on/off switch. Electrode adjusting mechanisms 68 and 70 are provided at mounting plates 55 and 56 for adjusting the distance between the electrodes as more fully set forth hereinbelow.

Fluid circulation lines 72 and 74 are connected to a conventional water supply and pump mechanism (not shown herein) and pass through electrically isolated openings through chamber 17 for circulating fluid in a system for cooling the plasma treatment zone (as more fully set forth hereinbelow). Fluid circulation lines 76, 77, 78 and 79 are likewise provided through electrically isolated openings through plates 55 and 56 for circulation of coolant adjacent to the electrodes. The openings are electrically isolated and sealed around lines 72 through 79 in a conventional manner, for example by providing grommets or o-ring seals at the opening through chamber 17.

As shown in FIGURE 1, gas mixing apparatus 81, including gas supply lines 83 and 85 (connected to pressurized gas supplies not shown herein), metered gas flow control valves 87 and 89, and gas mixing lines 91 and 93, is connected to main gas supply line 95 passing through sealable opening 97 in chamber 17 to thereby conventionally supply the gas used to form the plasma to the interior of chamber 17 and control the quantity of gases supplied. While only two separate gas supply lines 83 and 85 are shown for supply of gas to the interior of the chamber, more lines could be provided as may be required in a conventional manner.

As shown in FIG. 2, vacuum pumping station 100 is provided for evacuating chamber 17 to a low pressure and inducing gas flow through the chamber, and includes motor 102 and vacuum pump 103 connected to the chamber by outflow line 104. Pump 105 is connected by line 105' so that, together with pump 103, the desired gas flow through chamber 17 and low pressure environment is maintained. The output from pumping station 100 through exhaust line 106 may be filtered before release thereof into the environment.

Motor 108 (preferably a variable speed, reversible stepper or DC motor) is mounted to chamber 17 for driving the transport mechanism as more fully set forth hereinbelow.

The plate material used to construct the chamber may vary depending upon the application desired, the size of the chamber, and the degree of low pressure to be achieved within the chamber. The size and configuration of the chamber may also vary, depending on the application and desired throughput, and is, for example, a rectangular chamber having a width of 6 inches, a height of 35 inches and being 68 inches long. Conventional methods of securing together the various parts of the chamber above described may be used, for example welding, bolting and the like, care of course being taken to assure the chamber is substantially sealable in order to maintain the low pressure environment found desirable for plasma treating of the printed circuit boards.

Figure 4:
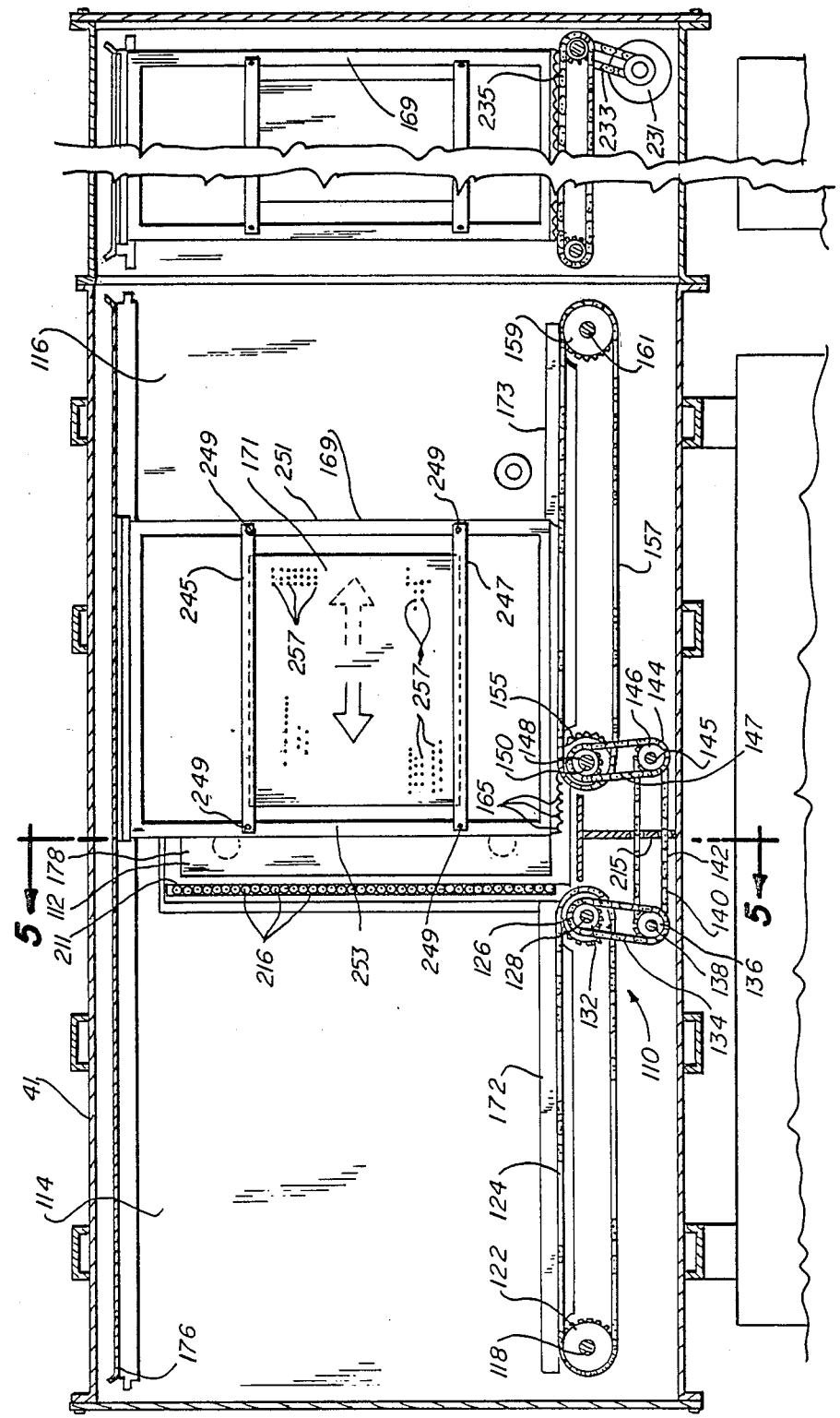
FIG. 4 is a cross-sectional view of the apparatus taken along section line 4—4 of FIG. 2.

FIGS. 3 through 5 illustrate the interior portions of the apparatus, and particularly illustrate an actuating mechanism utilized for causing relative movement between the objects to be treated and the electrical field established within the chamber.

Transport mechanism 110 extends through plasma treating zone 112 at the central portion of the chamber and between gas treating, or resupply zones 114 and 116 at opposite ends of the chamber. Motor 108 is connected by drive shaft 118 through bearing housing 120 to drive gear 122 for driving continuous drive chain 124. Drive chain 124 is driven around drive gear 122 and gear 126, gear 126 being mounted on shaft 128 through bearing housing 130 mounted on side wall 37. Also mounted on shaft 128 is drive gear 132 for driving continuous chain 134 around gear 36.

Gear 136 is mounted on shaft 138, shaft 138 being mounted through a bearing housing as shown with regard to the remainder of the gears described hereinabove and hereinbelow.

Gear 140 is also mounted on shaft 138 for driving continuous drive chain 142 and gear 144. Gear 144 is mounted on shaft 145 as set forth hereinabove, shaft 145 also having gear 146 mounted hereon (in an arrangement similar to that shown for gears 138 and 140) and which serves as the drive gear for continuous chain 147 maintained at its other end around gear 148 mounted on shaft 150 through bearing block 152 mounted to side wall 37. Gear 155 is driven by shaft 150 thereby driving continuous drive chain 157 also mounted on gear 159. Gear 159 is maintained on shaft 161 through bearing housing 163 mounted to side wall 37.

Chains 157 and 124 in this arrangement thus engage teeth 165 of printed circuit board positioning frame 169 for movement of the frame, and thus printed circuit board 171, linearly through the chamber between gas resupply zone 114 and 116 thereof.

Printed circuit board 171 may be any of the wide variety of such boards known in the industry, including multilayered boards typically having one or more substrate layers subject to treatment by plasma, as well as one or more conductive layers which remain substantially uneffected thereby.

While a chain and gear arrangement has been shown herein for moving the printed circuit boards within the chamber, other drive mechanisms as would be apparent to those skilled in the art could be utilized, for example a belt drive employing rollers and positioning frame engaging teeth on the drive belt, or a mechanism for movement of the framework from the upper portion of the chamber (as for example by hanging positioning frame 169 from a drive belt or chain thereat).

Stabilizer guides 172 and 172' are provided adjacent to the sides of chain 124, and guides 173 and 173' adjacent to the sides of chain 157, for guiding frame 169 on the chains and are preferably made of or coated with a teflon material. The guides may, for example, be bolted to lower chamber divider walls 174 and 175. Upper guide channel 176 is provided for receiving and guiding the upper portion of frame 169 and is attached (for example by riveting, bolting, welding or the like) to upper chamber wall 41.

Oppositely facing electrodes 178 and 179 are positioned at the central portion of the chamber, with electrode 178 mounted on insulating rods 180 and 182, and electrode 179 mounted on insulating rods 184 and 186. Electrodes 178 and 179 which may be, for example, ¼ inch thick, 28 inches high and 5 inches wide, are connected to power supply lines 63 and 64 and connectors 187 and 188.

Alternatively, magnetically enhanced electrodes (for example Airco Temescal's planar magnetron sputtering cathodes described in U.S. Pat. No. 4,166,018 to Chapin) may be used in the invention to further intensify plasma formation at the central portion of the chamber. Such electrodes achieve a greater degree of ionization of gas molecules because of the increased density of free electrons adjacent to the face of the electrodes. Where such electrodes are employed, the chamber may also be used, in a continuous operation, to sputter copper and/or other materials on the surfaces of the boards after etching and activation of board surfaces by plasma treating as described hereinbelow.

Insulating rods 180, 182, 184 and 186 are attached to support plates 189 and 190. The area of chamber 17 between the surfaces of electrodes 178 and 179 substantially corresponds with plasma treating zone 112.

Mounting rods 191, 192, 193 and 194 are maintained at one end thereof in guide cylinders 195, 196, 197 and 198 attached to electrode mounting plates 55 and 56, and to support plates 189 and 190 at their other end. Adjusting rods 199 and 200 are bolted centrally to support plates 189 and 190 and pass through mounting plates 55 and 56 at their threaded end. The threaded ends are thus engaged by rotatable cylinders 201 and 202 having mating threads on the interior portion thereof and which are rotated by attached handles 203 and 204 of adjusting mechanisms 68 and 70 in mechanism housings 205 and 206 attached to mounting plates 55 and 56. Rotation of the handles thus will adjust the distance between electrodes 178 and 179 at plasma treating zone 112.

Electrode cooling lines 76, 77, 78 and 79 extend through insulators 20 and 208 at support plates 189 and 190 for circulation of coolant (water for example) through cooling coils 209 and 210 on electrodes 178 and 179.

Chamber dividers 211, 212, 213 and 214 are provided for further isolating the electrical field at plasma treating zone 112, and for limiting the overall gas flow area (in conjunction with shield 215) to and from plasma treating zone 112 at the central portion of the chamber thereby providing an increased gas flow rate through the plasma treating section (preferably a 6 to 1 constriction of the opening through the chamber). Cooling coils 216 (preferably a single coil interconnected with all four dividers) is attached to the dividers and are connected to input and outflow liquid supply lines 72 and 74 (also shown in FIGS. 1 and 2).

Main gas supply line 95 from gas mixing apparatus 81 is positioned at one end portion of the chamber (in gas resupply area 116) and vacuum pump line 104 is connected to chamber 17 (for example by bolting of a flange connection to the chamber side wall) at outflow opening 217 at the opposite end portion of the chamber adjacent to gas resupply zone 114 for thus establishing a overall gas flow between the opposite ends of the chamber and through the plasma treating zone 112 to outflow opening 217.

Cassette loader and unloader 20 (shown in FIGS. 3 and 4) is of conventional design and includes drive motor 231 (preferably a stepper motor) for conventionally driving drive chains 233 and 235 for guiding the plurality of frames 169 into and out of chamber 17 through lock 240.

Sensors 242 and 244 are provided at the ends of the transport mechanism and provide, in a conventional manner (as for example by switching or optical sensing), reversing of the direction of drive of motor 108 when frame 169 has traveled to the ends of chamber 17. Alternatively, when using stepper motors for motor 108 and/or motor 231, reversal of the direction of the movement of frames 169 (and/or timing of loading and unloading thereof from cassette loader 20) could be made programmable for use with a microprocessor for overall control of the system.

In operation, a frame 169 is loaded into chamber 17 at gas resupply zone 116. Vacuum pumps 103 and 105 are then activated for evacuating the chamber to a low pressure and a gas or mixture of gases is introduced into the chamber. For example, a suitable gas mixture used for plasma formation upon excitement thereof by exposure to an electrical field is an 80% $O_2$, 10% $N_2$, and 10% $CF_4$ mixture. The chamber is evacuated to a pressure of 250 millitorr while pumping a volume of 300 to 500 CFM at STP from the chamber, so that a gas flow of about 1 liter per minute is maintained. Other suitable gas mixtures, pressures and flow rates, depending on the particular application, are of course known to those skilled in the art.

Power is then applied to each of the electrodes (with the chamber serving as ground). While the type and quantity of power required at the electrodes is variable depending on the gas flow rate, the pressure maintained within the chamber, and the gas mixture used, radio frequency power applied to the electrodes from 2.5 to 5 kilowatts at 50 Khz could be utilized in chamber 17 for the hereinabove described application. Exposure to the electrical field excites the gas molecules thus forming a low temperature, intense plasma at plasma treatment zone 112 in the space between electrodes 178 and 179 (causing the gas molecules in zone 112 to dissociate and form free radicals and ions) while it has been found that gas in gas resupply zones 114 and 116 remains substantially uneffected.

Further confinement of the plasma to the zone between the faces of the electrodes (rather than plasma creation in all areas surrounding the electrodes) may be achieved by supplying the RF signal to the electrodes so that the signal at electrode 178 is 180° out of phase with the signal at electrode 179. As shown in FIG. 6, by providing transformer 248 between the RF power supply and the electrodes the signal received at each electrode is 180° out of phase with the other. When used in conjunction with magnetically enhanced electrodes (as previously set forth) confinement and intensity of the plasma zone is particularly pronounced.

Positioning frame 169 holds one or more circuit boards 171 therein, for example by providing channel members 245 and 247 (although more could be used, for clamping a plurality of horizontal rows of circuit boards 171) for maintaining circuit boards 171 therebetween. Channel members 245 and 247 are attached by screws 249 to frame members 251 and 253. Frame 169 is then moved between the opposite end portions of chamber 17 and through plasma treatment zone 112 thus progressively exposing the circuit boards to the plasma so that the boards are linearly scanned by the intense plasma as the board passes through plasma treatment zone 112.

As the board travels from the opposite end portions of the chamber the board is first exposed to fresh gas in gas resupply zone 116 thus allowing openings 257 in circuit board 171 to receive a fresh supply of gas therein before passing through the plasma treatment zone 112. As circuit boards 171 pass through plasma treatment zone 112 and into gas resupply area 114 gas is again replenished in openings 257 before the motion is reversed and the board is again passed through the plasma treatment zone. In this manner the circuit boards are uniformly etched since they are scanned linearly through a plasma region thereby providing a more equal exposure of all areas of the boards to the plasma. The openings through the circuit boards receive a fresh supply of gas while in the gas resupply areas, with the gas in the openings then being charged while exposed to the electrical field in plasma treating zone 112 thereby enhancing the etch rate in the openings even when the openings are very small and/or of extended length.

For example, and as illustrated in the summary of test data in FIG. 7, when boards (tests herein were performed on multilayers boards) are moved through the chamber at 30 feet per minute, 60 passes through plasma treating zone 112 provides one minute of plasma treating, or etching, at any given location of each of the printed circuit boards in the framework. With 2.5 kilowatts of power supplied to the electrodes, the etch rate (measured at the walls of the openings through the circuit boards) will vary depending on chamber pressure, substrate material used, gas mixture, flow rate, substrate temperature, signal frequency, electrode characteristics and the like.

Line A in FIG. 7 shows an etch rate achieved using Kapton (trade name for flame retardant polyimide film produced by Dupont). Line B shows the etch rates for a glass epoxy laminate material, while line C shows the etch rates for Ultem (a GE trademark for a polyetherimide material). As can be seen, the etch rate within the openings varied substantially with increased pressure. At 250 mTorr the etch rate achieved varied in a range from approximately 0.14 mil/minute to 0.23 mil/minute depending on the material, and with the rate and degree of etch back appearing quite uniform through the opening. The rate of transport of boards through the chamber may of course be varied depending on exposure time desired, material used and other variables as would be apparent to those skilled in the art.

Where sputtering cathodes are used in the apparatus of this invention (as previously discussed), there is no need to remove boards from the chamber where copper or the like is to be deposited on the surfaces thereof after etching and activation of the surfaces of the boards. In such cases the chamber is evacuated, and the pressure is reduced (for example to 5 mTorr). An appropriate gas mixture (for example Argon) is the introduced into the chamber as required for sputtering of the metallic layer. Other system changes may be desirable (for example, the circulation pump may be changed from a Roots blower to a turbomolecular blower and a DC power supply may be substituted) and may be accomplished with little difficulty or down time.

While the actuating mechanism herein described is a transport mechanism 110 for transport of printed circuit boards through a plasma treating zone and gas resupply zones, it should be realized that other arrangements for accomplishing the objects of this invention could be employed as would be apparent to those skilled in the art. For example, a single plasma treatment zone and gas resupply zone could be employed with the transport mechanism repeatedly moving the printed circuit boards into and out of the two zones.

Additionally, arrangements could be provided for a transport mechanism attached to the electrodes for moving the pair of electrodes within the chamber thus essentially transporting the plasma treatment zone from end to end in the chamber while maintaining the circuit boards therein in a stationary position. Likewise, a plurality of pairs of electrodes could be arranged within a chamber extending linearly on each side of a plurality of circuit boards stationarily arranged therebetween, and with power being sequentially supplied to the different pairs from end to end to thereby effectively move the plasma treating zone and the gas resupply areas within the chamber.

The type of chamber employed for plasma treating could be varied (a tank type chamber, as has been heretofore known, for example, could be utilized). A number of the other elements herein described, for example the chamber, the electrodes, the pumping station, the gas mixing apparatus and the cassette loader and unloader, while perhaps differing in some regard, are in their broad application known to those skilled in the art, their usage in the overall combination of elements and method herein specified, and in particular in combination with an actuating mechanism as herein described, providing a novel and advantageous usage of such elements.

As may be appreciated from the foregoing, an improved apparatus and method for plasma treating of objects, specifically printed circuit boards, is provided herein which utilizes an actuating mechanism for effecting relative movement between the objects and a plasma treating zone and one or more gas resupply zones for progressively exposing the circuit boards for preselected periods of time to the plasma for treatment thereof and to unexcited gas for supplying fresh gas within openings through the circuit boards thus providing a more uniform plasma treatment, or etching of the surface areas of the circuit board and improved desmearing and etchback of the openings through the circuit boards which receive a fresh supply of gas therein when the circuit board is outside of the plasma treatment zone.

What is claimed is:

1. A method for treating objects using a gas excited within an electrical field, said method comprising:
    establishing an excited gas zone having the gas excited within the electrical field thereat;
    establishing a gas zone having gas therein not exposed to the electrical field so that the gas thereat remains substantially unexcited; and
    exposing said objects alternately to said unexcited gas and said excited gas for preselected periods of time.

2. The method for treating objects of claim 1 wherein said method further comprises providing chamber means for establishment of said zones therein, introducing the gas into said chamber means, and establishing said electrical field within said chamber means at said excited gas zone.

3. The method for treating objects of claim 2 wherein said step of establishing an electrical field within said chamber means includes the steps of establishing said electrical field at a central portion of said chamber means so that said gas thereat is excited forming a plasma thereby establishing said excited gas zone for plasma treating of said objects at said central portion of said chamber means.

4. The method of claim 3 wherein said step of exposing said objects alternately to said unexcited gas and said excited gas includes the steps of moving said objects into and out of said central portion of said chamber means thus positioning said objects alternately within said excited gas zone and said gas zone.

5. The method of claim 4 wherein said objects are printed circuit boards having a plurality of openings therethrough, and wherein said step of exposing said printed circuit boards alternately to said unexcited gas and said excited gas includes the step of resupplying unexcited gas within said openings of said printed circuit boards when said printed circuit boards are moved into said gas zone.

6. The method of claim 1 wherein said step of exposing said objects alternately to said unexcited gas and said excited gas includes the step of progressively exposing said objects to said excited gas so that said objects are linearly scanned by said excited gas.

7. The method for treating objects of claim 2 wherein said method includes the step of evacuating said chamber means to a low pressure before introducing the gas into said chamber means.

8. The method for treating objects of claim 3 wherein said method includes the steps of establishing a flow of the gas through said chamber means and constricting said flow of gas at said excited gas zone to provide an increased gas flow rate therethrough relative to the rate of gas flow through said gas zone.

9. An apparatus for treating objects with a gas excited within an electrical field, said apparatus comprising:
    gas establishing means for providing a gas at first and second treating zones;
    electrical field establishing means for establishing an electrical field at said first treating zone so that gas exposed to the electrical field thereat is excited while gas in said second treating zone remains unexcited; and
    actuating means for causing said objects to be alternately exposed to said excited gas and to said unexcited gas for preselected periods of time.

10. The apparatus of claim 9 wherein said gas establishing means includes chamber means, and wherein said apparatus further comprises positioning means for establishing preselected orientation of said objects within said chamber means relative to said electrical field.

11. The apparatus of claim 10 wherein said apparatus further comprises pressure reducing means connected to said chamber means for reduction of the pressure within said chamber means, and wherein said electrical field establishing means includes a radio frequency power source and oppositely facing electrodes.

12. The apparatus of claim 11 wherein said electrical field establishing means includes phase control means for establishing an electrical signal at one of said electrodes which is 180 degrees out of phase with respect to the signal at the other of said electrodes.

13. The apparatus of claim 11 wherein said actuating means includes transport means for causing said objects to be moved into and out of said zones.

14. The apparatus of claim 9 wherein said objects are printed circuit boards having openings therethrough, and wherein said actuating means includes means for progressively exposing said printed circuit boards to said excited gas so that said printed circuit boards are linearly scanned by said excited gas.

15. The apparatus of claim 14 wherein said actuating means includes means for repeatedly exposing said printed circuit boards to said excited gas and to said unexcited gas so that said unexcited gas is resupplied within said openings in said printed circuit boards between said progressive exposures of said printed circuit boards to said excited gas to thereby provide a more uniform treatment of said printed circuit boards and said openings therethrough.

16. The apparatus of claim 9 wherein said electrical field establishing means includes first and second magnetically enhanced electrode means for concentrating said excited gas therebetween.

17. An apparatus for plasma treating of printed circuit boards, said printed circuit boards having openings therethrough, said apparatus comprising:
- chamber means for receiving and containing a gas and having first and second chamber zones;
- electrode means positioned at said first chamber zone of said chamber means for providing an electrical field sufficient to excite said gas in said first chamber zone of said chamber means thereby forming said plasma thereat; and
- transport means for transporting said printed circuit boards between said first and second chamber zones of said chamber means so that said printed circuit boards are alternately exposed for preselected periods of time to said gas at said second chamber zone of said chamber means, thereby re-supplying said gas within said openings through said printed circuit boards, and said plasma at said first chamber zone of said chamber means.

18. The apparatus of claim 17 wherein said chamber means has a central portion and opposite end portions on each side of said central portion, and wherein said first chamber zone is located at said central portion and said second chamber zone is located at said opposite end portions of said chamber means.

19. The apparatus of claim 18 wherein said apparatus further includes pressure reducing means for substantially reducing the pressure within said substantially sealable chamber means and promoting flow of said gas between said opposite end portions and through said central portion thereof.

20. The apparatus of claim 19 wherein said chamber means includes gas flow constricting means adjacent said central portion thereof so that the rate of flow of said gas through said central portion is increased relative to the rate of flow of said gas through said opposite end portions.

21. The apparatus of claim 20 wherein said apparatus further includes cooling means for cooling said electrode means and said central portion of said chamber means.

22. The apparatus of claim 21 wherein said apparatus further comprises printed circuit board loading and unloading means connected with said substantially sealable chamber.

* * * * *